United States Patent
Cai et al.

(10) Patent No.: US 9,397,158 B2
(45) Date of Patent: Jul. 19, 2016

(54) FABRICATING SHALLOW-TRENCH ISOLATION SEMICONDUCTOR DEVICES TO REDUCE OR ELIMINATE OXYGEN DIFFUSION

(71) Applicant: GlobalFoundries U.S. 2 LLC, Hopewell Junction, NY (US)

(72) Inventors: Ming Cai, Hopewell Junction, NY (US); Dechao Guo, Fishkill, NY (US); Liyang Song, Wappingers Falls, NY (US); Chun-chen Yeh, Clifton Park, NY (US)

(73) Assignee: GLOBALFOUNDRIES INC., Grand Caymen (KY)

( * ) Notice: Subject to any disclaimer, the term of this patent is extended or adjusted under 35 U.S.C. 154(b) by 0 days.

(21) Appl. No.: 14/662,468

(22) Filed: Mar. 19, 2015

(65) Prior Publication Data

US 2015/0194484 A1  Jul. 9, 2015

Related U.S. Application Data

(62) Division of application No. 14/053,674, filed on Oct. 15, 2013, now Pat. No. 9,059,244.

(51) Int. Cl.
| | |
|---|---|
| *H01L 21/762* | (2006.01) |
| *H01L 29/06* | (2006.01) |
| *H01L 29/78* | (2006.01) |
| *H01L 29/51* | (2006.01) |

(52) U.S. Cl.
CPC ...... *H01L 29/0649* (2013.01); *H01L 21/76224* (2013.01); *H01L 29/517* (2013.01); *H01L 29/7846* (2013.01)

(58) Field of Classification Search
CPC .......... H01L 21/76224; H01L 21/76232; H01L 21/823807; H01L 29/7846
See application file for complete search history.

(56) References Cited

U.S. PATENT DOCUMENTS

| | | |
|---|---|---|
| 6,657,276 B1 | 12/2003 | Karlsson et al. |
| 6,699,773 B2 | 3/2004 | Lee et al. |
| 7,364,975 B2 | 4/2008 | Culmsee et al. |
| 7,611,964 B2 | 11/2009 | Cho et al. |
| 7,701,016 B2 | 4/2010 | Kishii et al. |
| 7,723,818 B2 | 5/2010 | Tilke et al. |

(Continued)

OTHER PUBLICATIONS

Tilke, A. et al.; "Shallow Trench Isolation of the 45-nm CMOS Node and Geometry Dependence of STI Stress on CMOS Device Performance"; IEEE Transactions on Semiconductor Manufacturing, vol. 20, No. 2; May 2007; whole document (9 pages).

(Continued)

*Primary Examiner* — John C Ingham

(57) ABSTRACT

A method is disclosed for forming a semiconductor device. A first opening is formed for an STI on a semiconductor substrate and a first process is performed to deposit first oxide into the first opening. A second opening is formed to remove a portion of the first oxide from the first opening and second process(es) is/are performed to deposit second oxide into the second opening and over a remaining portion of the first oxide. A portion of the semiconductor device is formed over a portion of a surface of the second oxide. A semiconductor device includes an STI including a first oxide formed in a lower portion of a trench of the STI and a second oxide formed in an upper portion of the trench and above the first oxide. The semiconductor device includes a portion of the semiconductor device formed over a portion of the second oxide.

20 Claims, 9 Drawing Sheets

(56) References Cited

U.S. PATENT DOCUMENTS

| | | |
|---|---|---|
| 7,737,009 B2 | 6/2010 | Lindsay et al. |
| 7,795,107 B2 | 9/2010 | Hampp et al. |
| 7,943,456 B2 | 5/2011 | Yu et al. |
| 8,319,311 B2 * | 11/2012 | Chen ................ H01L 21/76232 257/510 |
| 9,059,244 B2 | 6/2015 | Cai et al. |
| 2003/0013272 A1 * | 1/2003 | Hong ................ H01L 21/76224 438/437 |
| 2006/0220142 A1 | 10/2006 | Tamura |
| 2010/0230757 A1 | 9/2010 | Chen et al. |
| 2011/0049669 A1 | 3/2011 | Lee |
| 2011/0195559 A1 | 8/2011 | Chen et al. |

OTHER PUBLICATIONS

Office Action Communication Dated Nov. 17, 2015, U.S. Appl. No. 14/662,743, pp. 1-17.

* cited by examiner

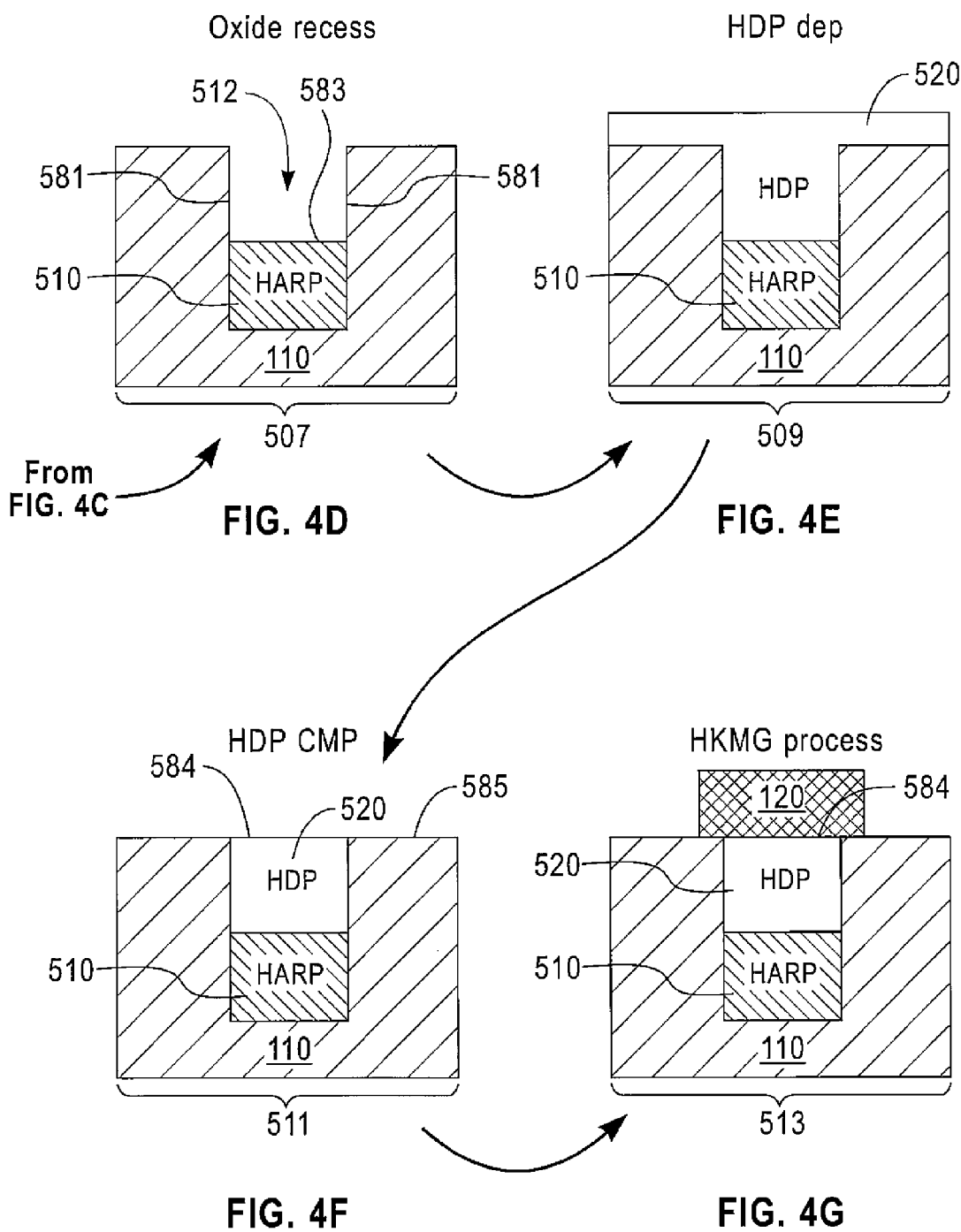

FABRICATING SHALLOW-TRENCH ISOLATION SEMICONDUCTOR DEVICES TO REDUCE OR ELIMINATE OXYGEN DIFFUSION

CROSS REFERENCE TO RELATED APPLICATION

This application is a divisional application of and claims priority to copending U.S. patent application Ser. No. 14/053,674, filed on Oct. 15, 2013, the contents of which are incorporated herein by reference in their entirety.

TECHNICAL FIELD

The exemplary embodiments of this invention relate generally to semiconductor devices and more particularly to structures and manufacturing methods for reducing or eliminating oxygen diffusion in shallow-trench isolation (STI) semiconductor devices.

BACKGROUND

Integrated circuits are formed on the surfaces of semiconductor substrates such as silicon. Semiconductor devices are isolated from one another through the use of isolation structures formed at the surfaces of the respective semiconductor substrates. The isolation structures include field oxides and shallow trench isolation (STI) regions.

A common design objective is to decrease or minimize the required physical size of an integrated circuit. This downscaling may be facilitated by using STI regions as isolation structures. FIG. 1 illustrates an exemplary STI region. An opening 112 is formed in a substrate 110, for example, by etching. The opening 112 has an aspect ratio, which is equal to the ratio of depth D1 to width W1. This aspect ratio increases as integrated circuits are scaled down in size. For 40 nm technology and below, the aspect ratio may be greater than 7.0. A liner 114 is formed in the opening 112. Next, an oxide, preferably a silicon oxide, is filled into the opening 112, until the top surface of the oxide is higher than the top surface of the substrate 110.

The oxide is filled into the opening 112 using either high-density plasma chemical vapor deposition (HDPCVD, also known as HDP), or a high aspect-ratio process (HARP). HARP is used to fill trenches having relatively high aspect ratios, whereas HDP is used in situations where oxygen content is to be minimized. For example, the HDP technique is used to fill gaps with aspect ratios no greater than 6.0, whereas the HARP technique is used to fill gaps with aspect ratios that are greater than 6.0.

Another distinction between HARP and HDP relates to the concentration of oxygen in the oxide that is filled into the opening 112. In general, HARP provides a higher concentration of oxygen in oxide formed by HARP as compared to oxide formed by HDP. This higher oxygen concentration is a concern when fabricating high dielectric constant metal gate. (HKMG) transistors because the oxygen may change the threshold voltage of the transistor to an unacceptable extent.

If the oxygen migrates or diffuses into a gate stack of the STI semiconductor device where the device comprises an HKMG transistor, the threshold voltage of the HKMG transistor may change significantly. Moreover, if the STI semiconductor device includes a divot, oxygen diffusion into the gate stack will be further enhanced.

SUMMARY

This section provides examples of possible implementations of exemplary embodiments. This section is not intended to be limiting.

A first exemplary embodiment is a method for forming a semiconductor device including a shallow trench isolation. The method includes forming a first opening for the shallow trench isolation on a semiconductor substrate and performing a first process to deposit first oxide into the first opening. The method also includes forming a second opening to remove a portion of the first oxide from the first opening and performing at least one second process to deposit second oxide into the second opening and over a remaining portion of the first oxide. The method further includes forming at least a portion of the semiconductor device over and contacting at least a portion of a surface of the second oxide.

Another exemplary embodiment is a semiconductor device. The semiconductor device includes a shallow trench isolation formed in a semiconductor substrate. The shallow trench isolation includes a first oxide formed in a lower portion of a trench of the shallow trench isolation and a second oxide formed in an upper portion of the trench and above a surface of the first oxide. The semiconductor device includes a portion of the semiconductor device formed over and contacting at least a portion of a surface of the second oxide.

A further exemplary embodiment is an article of manufacture for forming a semiconductor device comprising a shallow trench isolation. The article of manufacture includes a computer-readable storage medium that contains computer program instructions. Execution of the computer program instructions by at least one data processor results in performance of operations that include at least the following: forming a first opening for the shallow trench isolation on a semiconductor substrate; performing a first process to deposit first oxide into the first opening; forming a second opening to remove a portion of the first oxide from the first opening; performing at least one second process to deposit second oxide into the second opening and over a remaining portion of the first oxide; and forming at least a portion of the semiconductor device over and contacting at least a portion of a surface of the second oxide.

DETAILED DESCRIPTION

Figure 2:
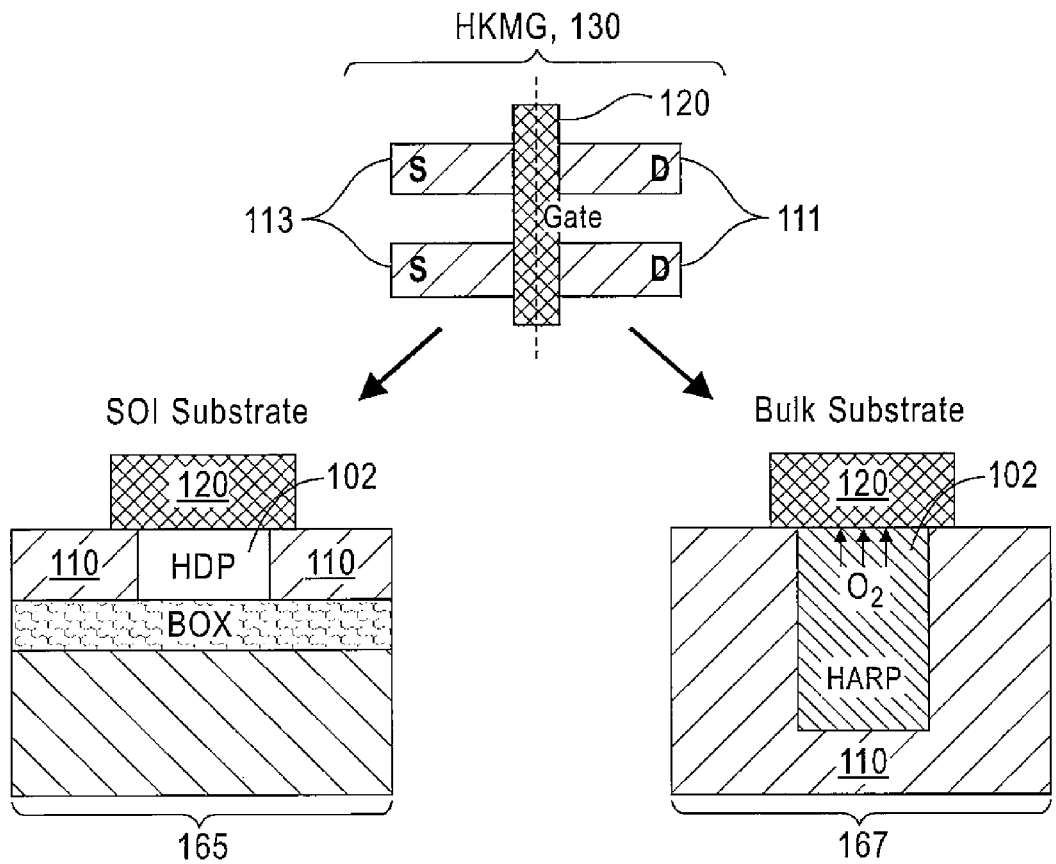
FIG. 2 is a simplified cross-sectional view showing formation of a shallow trench isolation, high dielectric constant metal gate (HKMG) transistor using either a high aspect ratio process or a high-density plasma process.

FIG. 2 is a simplified cross-sectional view showing formation of a shallow trench isolation, high-dielectric-constant metal gate (HKMG) transistor 130 using either a high aspect ratio process (HARP) on a bulk silicon substrate 167, or a high-density plasma (HDP) process on a Silicon On Insulator (SOI) substrate 165. Notably, for both the HARP process and the HDP process, oxygen diffusion, migration, and releases from the HKMG transistor 130 during front-end-of-line (FEOL) thermal processes may adversely impact the threshold voltage of the HKMG transistor 130. The threshold voltage ($V_t$) is a voltage level that determines whether a transistor will be on or off. For example, in cases where the HKMG transistor 130 is an nFET, if the gate 120 is above $V_t$, then the nFET transistor is on. If the gate 120 is below $V_t$, then the nFET transistor is off. In cases where the HKMG transistor 130 is a pFET, complementary behavior will be observed. In other words, if the gate 120 of the pFET transistor is above $V_t$, then the pFET transistor is off. If the gate 120 is below $V_t$, then the pFET transistor is on.

The HKMG transistor 130 includes one or more source 113 elements, one or more drain 111 elements, and a gate 120. For SOI wafers such as the SOI substrate 165, HDP can be used to form the isolation region 101 in the HKMG transistor 130 due to the presence of a buried oxide (BOX) layer 125 underneath the substrate 110. However, in the case of bulk wafers such as the bulk substrate 167, HARP is used to provide the relatively deep trenches for isolation region 102 required for isolation. In general, HDP provides semiconductor devices (e.g., especially the oxide formed using HDP) having lower oxygen concentration relative to (e.g., oxides formed using) HARP. For applications involving high-k metal gates (HKMGs), the presence of oxygen can degrade gate performance. For example, undesirable oxygen diffusion and penetration may occur into the gate 120 stack, thus providing a semiconductor device with an unpredictable $V_t$ that may differ substantially from the desired or target $V_t$.

As elements in semiconductor devices have been reduced to sizes on the order of 45 nanometers or smaller, non-metal gate dielectrics such as silicon dioxide begin to lose their insulating properties and exhibit too much current leakage. In order to address the current leakage problem, a hafnium-based dielectric layer may be employed with a gate electrode comprised of one or more metals. The resulting combination yields a high dielectric constant (or high k). In this context, k refers to the ability of a material to hold an electric charge. Illustratively, the gate 120 is a HKMG having a threshold voltage denoted as $V_t$.

Figure 1:
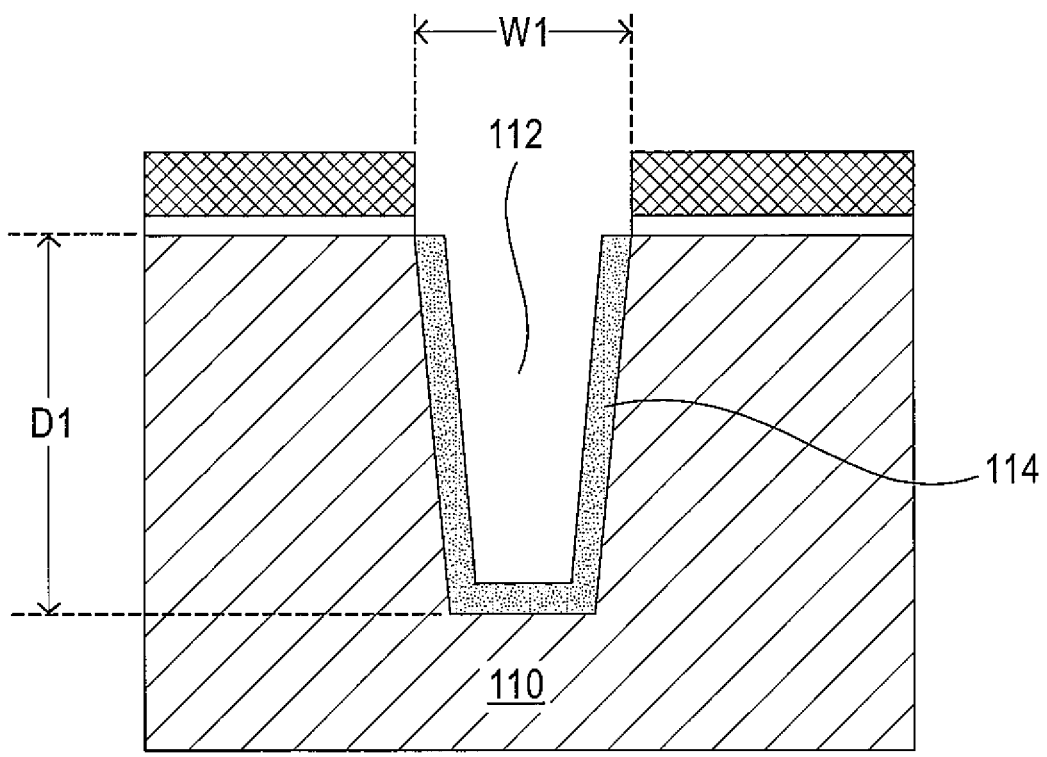
FIG. 1 is a simplified cross-sectional view of an exemplary shallow trench isolation in a semiconductor device.
Figures 3A, 3B:
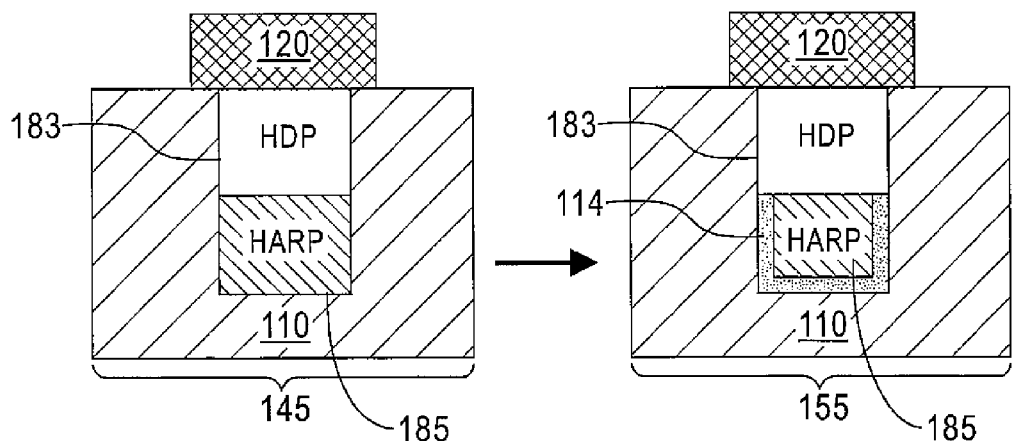
FIG. 3A is a simplified cross-sectional view setting forth a first exemplary shallow trench isolation and FIG. 3B is a second exemplary shallow trench isolation in a semiconductor device for reducing or eliminating oxygen diffusion.

FIG. 3A is a simplified cross-sectional view setting forth a first exemplary shallow trench isolation (STI) and FIG. 3B is a simplified cross-sectional view setting forth a second exemplary STI in a semiconductor device for reducing or eliminating oxygen diffusion and migration. The first and second exemplary STIs are both fabricated using HARP deposition followed by HDP and chemical mechanical planarization (CMP). By performing both the HARP process and the HDP process, a first exemplary hybrid STI 145 or a second exemplary hybrid STI 155 is provided that can be fabricated on a bulk substrate 110 (FIGS. 1 and 2) which provides isolation of a semiconductor device and also addresses undesired oxygen diffusion and ingress into the gate 120 region (FIGS. 2 and 3). The first exemplary hybrid STI 145 in FIG. 3A is fabricated by performing HDP on an upper portion of a HARP region to form an HDP region 183 and a remaining HARP region 185. A gate 120 is then added which may, but need not, be a HKMG. The second exemplary hybrid STI 155 in FIG. 3B is fabricated using an optional liner 114. The optional liner 114 at least partially surrounds or partially encases or adjoins the outer perimeter of the remaining HARP region 185. The optional liner 114 may be fabricated using any of a high-k material, an oxygen sink, and/or an oxygen barrier. An oxygen sink is any insulator that can absorb oxygen efficiently, such as $HfO_2$ and/or $HfSiO_4$. An oxygen barrier is any insulator that can block oxygen diffusion such as SiN. Thus, one purpose of the optional liner 114 is to serve as an oxygen sink or oxygen barrier for absorbing oxygen that may otherwise diffuse into the gate 120 region.

Figure 4A:
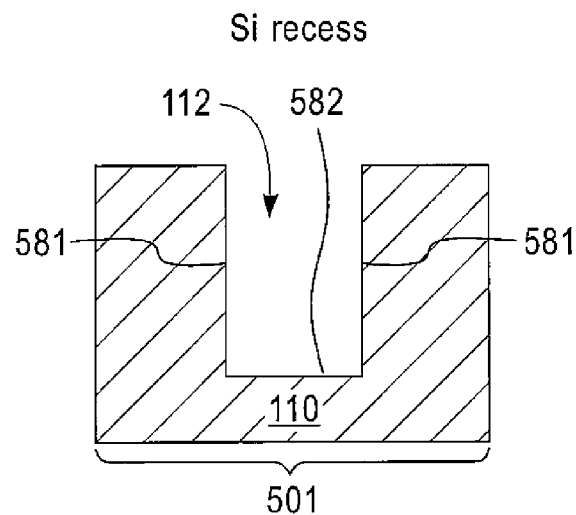
FIG. 4, including FIGS. 4A through 4G, sets forth a first exemplary method for fabricating a shallow trench isolation in a semiconductor device using a high aspect ratio process followed by a high-density plasma process.
Figure 4B:
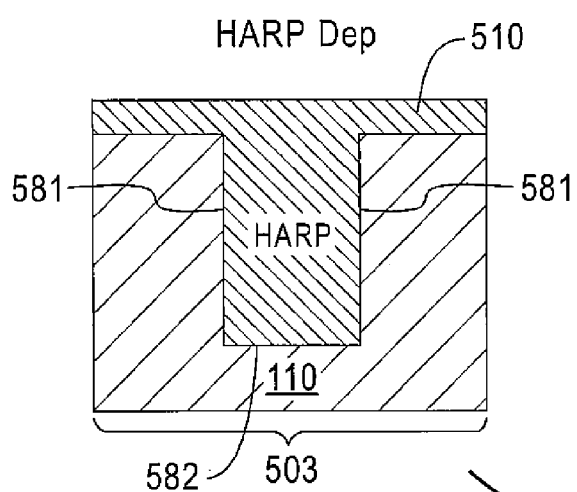
Figure 4C:
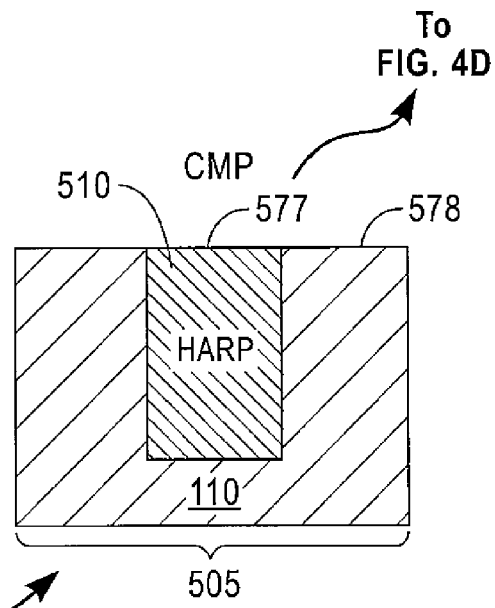

FIG. 4, including FIGS. 4A through 4G, sets forth a first exemplary method for fabricating a shallow trench isolation in a semiconductor device using a HARP process followed by a HDP process. At block 501 as shown in FIG. 4A, a recess or opening (e.g., a trench for STI) 112 is formed in a silicon substrate 110. The formation exposes side surfaces 581 and a bottom surface 582. Next, at block 503 as shown in FIG. 4B, a process of HARP deposition is performed to deposit oxide 510 in the opening 112. The oxide 510 at least partially conforms to and contacts the surfaces 581, 582. The oxide that was deposited using HARP is polished using, e.g., chemical mechanical planarization (CMP) at block 505 as shown in FIG. 4C. The polishing aligns a top surface 577 of the oxide 510 with a top surface 578 of the substrate 110.

A recess 512 is formed in the deposited oxide at block 507 as shown in FIG. 4D. The recess in this example exposes a top surface 582 of the oxide 510. Next, at block 509 as illustrated by FIG. 4E, a process of HDP deposition is used to fill the recess 512 with oxide 520. The oxide 520 at least partially conforms to and contacts the surfaces 581 of the substrate 110 and the top surface 583 of the oxide 510. The oxide 520 that was deposited using HDP is polished using CMP at block 511 as illustrated by FIG. 4F. A top surface 584 of the oxide 520 thus aligns with a top surface 585 of the substrate 110. At block 513 as shown in FIG. 4G, a high-k metal gate 120 is formed (e.g., via deposition and patterning) above (e.g., and in contact with) a surface 584 of the polished oxide that was deposited using HDP. The resulting semiconductor device reduces or minimizes undesired oxygen diffusion and ingress from the deposited oxide into the gate 120 region.

Figure 5A:
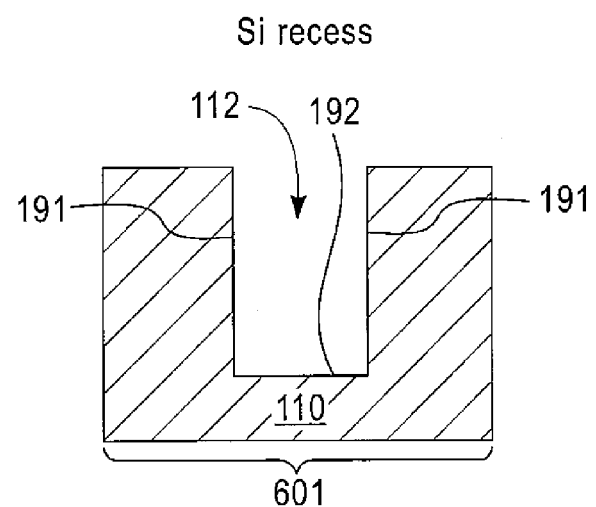
FIG. 5, including FIGS. 5A through 5G, sets forth a second exemplary method for fabricating a shallow trench isolation in a semiconductor device using a high aspect ratio process followed by a high-density plasma process wherein a liner may serve, e.g., as an oxygen barrier or an oxygen sink or both.
Figure 5B:
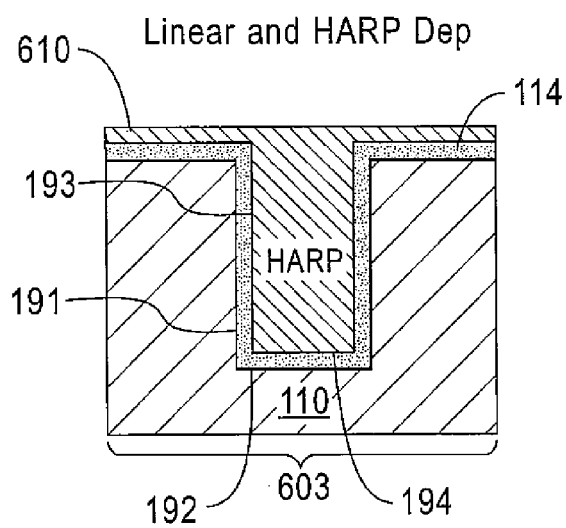
Figure 5C:
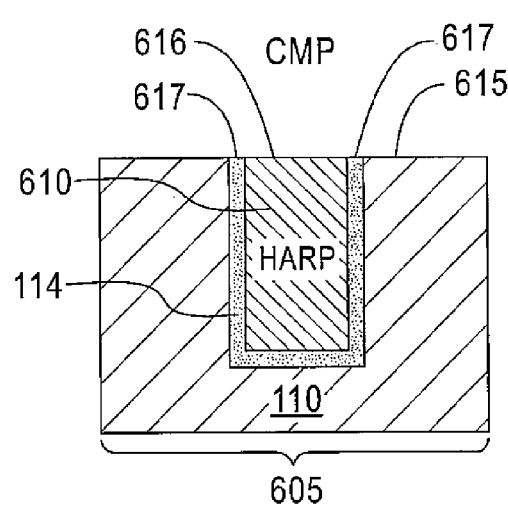

FIG. 5, including FIGS. 5A through 5G, sets forth a second exemplary method for fabricating a shallow trench isolation in a semiconductor device using a high aspect ratio process followed by a high-density plasma process. The method of FIG. 5 uses an optional liner 114 (see, e.g., FIG. 5B) that is fabricated using any of a high-k material, an oxygen sink, or an oxygen barrier. The liner forms to and contacts the inside surface of the opening 112. An oxygen sink is any insulator that can absorb oxygen efficiently, such as $HfO_2$ and/or $HfSiO_4$. An oxygen barrier is any insulator that can block oxygen diffusion such as SiN. Thus, one purpose of the optional liner 114 is to serve as an oxygen sink or oxygen barrier for absorbing oxygen that may otherwise diffuse into the gate 120 region. At block 601 as illustrated by FIG. 5A, a recess or opening 112 is formed in a silicon substrate 110. The opening 112 has exposed side surfaces 191 and a bottom surface 192. Next, at block 603 as shown in FIG. 5B, a process of liner and HARP deposition is performed to deposit a liner 114 (which at least partially conforms to and contacts the surfaces 191, 192) and oxide 610 in the opening 112 wherein the liner 114 at least partially encases the deposited oxide 610. The oxide 610 at least partially conforms to and contacts the side surfaces 193 and bottom surface 194 of the liner 114. The liner 114 and the oxide 610 that was deposited using HARP is polished using chemical mechanical planarization (CMP) at block 605 as shown in FIG. 5C, which aligns a top surface 616 of the oxide 610 and top surfaces 617 of the liner 114 with a top surface 615 of the substrate 110.

Figure 5D:
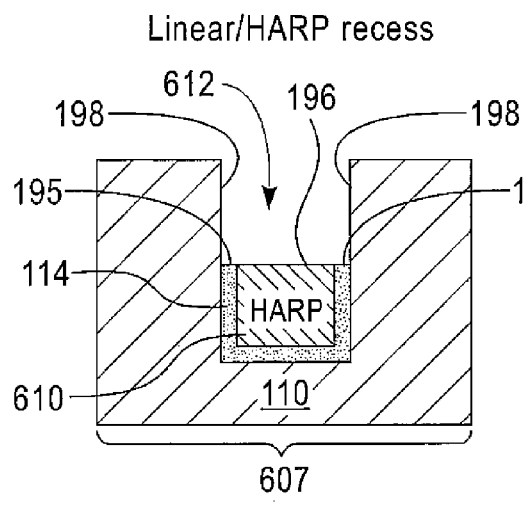
Figure 5E:
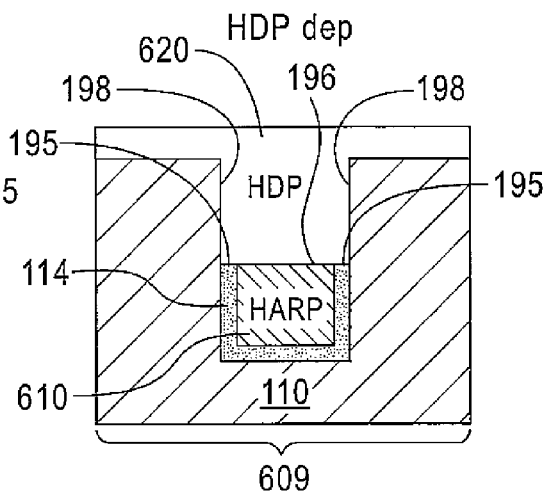
Figure 5F:
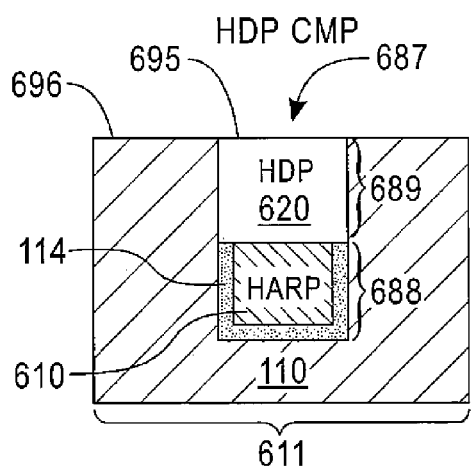
Figure 5G:
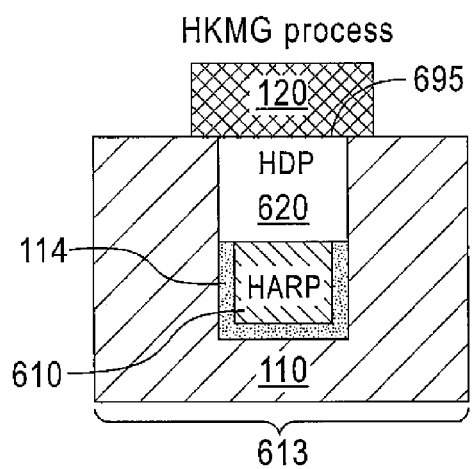

A recess or opening 612 is formed in the substrate 110 and is formed to remove deposited oxide 610 and liner 114 at block 607 as illustrated by FIG. 5D. Formation of the recess 612 exposes top surface 196 of the oxide 610, top surfaces 195 of the liner 114, and surfaces 198 of the substrate 110. Next, at block 609 as shown in FIG. 5E, a process of HDP deposition is used to fill the recess 612 with oxide 620. The oxide 620 at least partially conforms to and contacts the surfaces 195, 196, and 198. The oxide 620 that was deposited using HDP is polished using CMP at block 611 as illustrated by FIG. 5F. The polishing aligns a top surface 695 of the oxide 620 with a top surface 696 of the substrate 110. It can be seen that the oxide 620 fills an upper portion 689 (e.g., relative to the surface 696 of the substrate 110) of the trench 687 and the oxide 610 and liner 114 fill a lower portion 688 (e.g., relative to the surface 696 of the substrate 110) of the trench 687. At block 613 as shown in FIG. 5G, a high-k metal gate 120 is formed above the polished oxide 620 that was deposited using HDP and over and in contact with the surface 695 of the oxide 620. The resulting semiconductor device reduces or minimizes undesired oxygen diffusion and ingress from the deposited oxide into the gate 120 region.

Figure 6A:
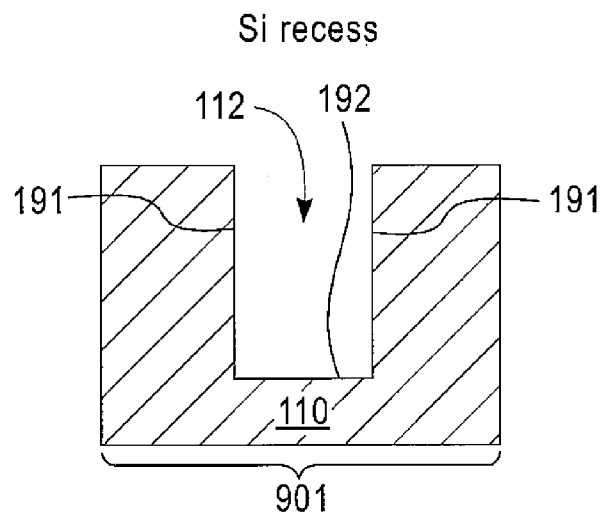
FIG. 6, including FIGS. 6A through 6G, sets forth a third exemplary method for fabricating a shallow trench isolation in a semiconductor device using a high aspect ratio process followed by a high-density plasma process wherein a liner may serve, e.g., as an oxygen barrier or an oxygen sink or both.
Figure 6B:
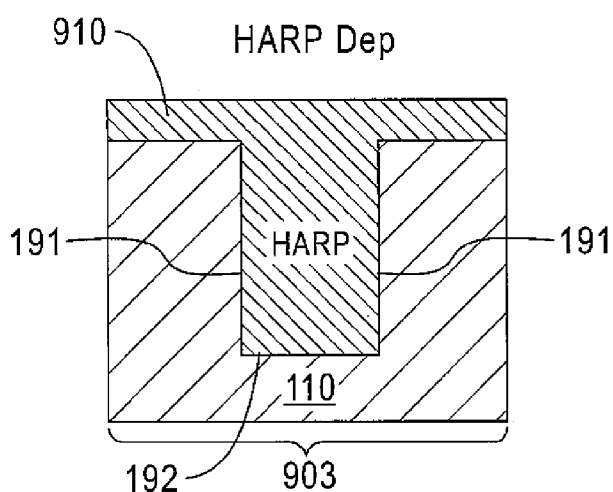
Figure 6C:
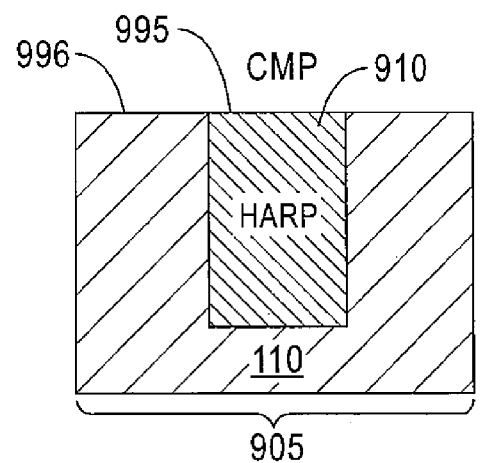

FIG. 6, including FIGS. 6A through 6G, sets forth a third exemplary method for fabricating a shallow trench isolation in a semiconductor device using a high aspect ratio process followed by a high-density plasma process. The method of FIG. 6 uses an optional liner 704 (see, e.g., FIG. 6E) that is fabricated using any of a high-k material, an oxygen sink, or an oxygen barrier. An oxygen sink is any insulator that can absorb oxygen efficiently, such as $HfO_2$ and/or $HfSiO_4$. An oxygen barrier is any insulator that can block oxygen diffusion such as SiN. Thus, one purpose of the optional liner 704 is to serve as an oxygen sink or oxygen barrier for absorbing oxygen that may otherwise diffuse into the gate 120 region. At block 901 as shown in FIG. 6A, a recess or opening 112 is formed in a silicon substrate 110. The opening 112 has exposed side surfaces 191 and a bottom surface 192. Next, at block 903 as illustrated by FIG. 6B, a process of HARP deposition is performed to deposit oxide 910 in the opening 112. The oxide 910 at least partially conforms to and contacts the surfaces 191, 192. The oxide 910 that was deposited using HARP is polished using chemical mechanical planarization (CMP) at block 905 as illustrated by FIG. 6C. The polishing aligns a top surface 995 of the oxide 910 with a top surface 996 of the substrate 110.

Figure 6D:
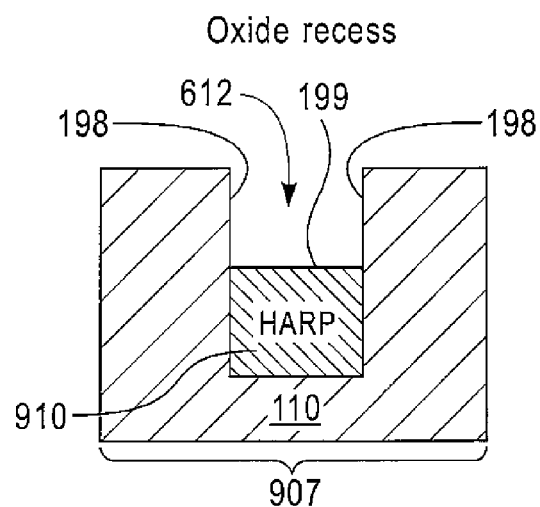
Figure 6E:
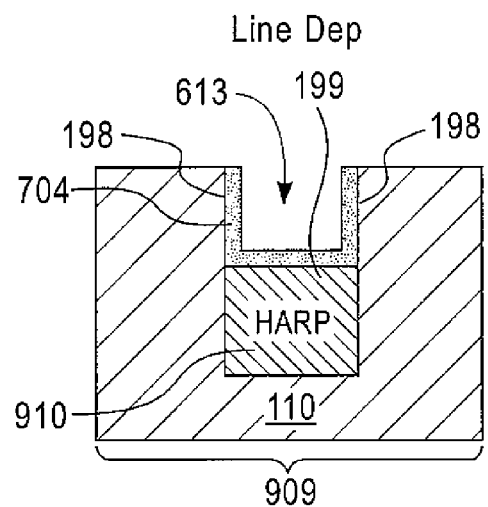
Figure 6F:
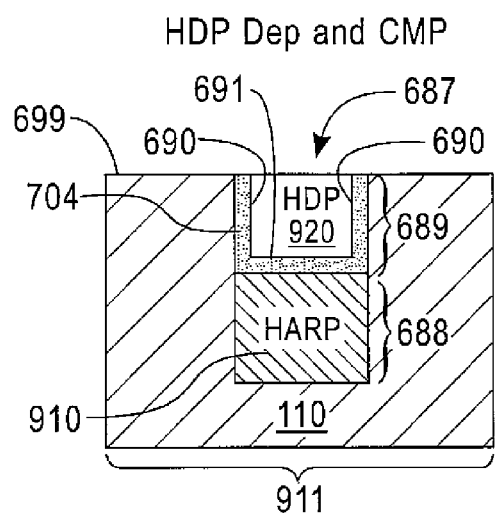
Figure 6G:
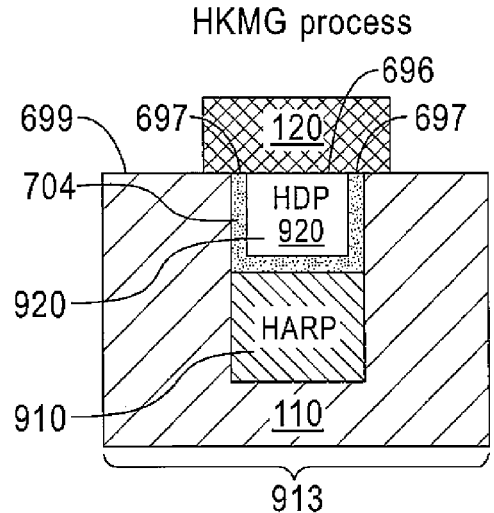

A recess 612 is formed in the substrate 110 and removes deposited oxide 910 at block 907 as indicated in FIG. 6D. The recess 612 exposes the surfaces 198 of the substrate and a top surface 199 of the oxide 610. Next, at block 909 as illustrated by FIG. 6E, a process of liner deposition is used to provide the liner 704 wherein the liner 704 at least partially conforms to and contacts the surfaces 198, 199 to provide a liner-encased recess 613. At block 911, illustrated by FIG. 6F, HDP deposition is used to fill the liner-encased recess 613 with oxide 920, and the oxide 920 that was deposited using HDP is polished using CMP. The oxide 920 at least partially conforms to and contacts the side surfaces 690 and bottom surface 691 of the liner 704. It can be seen that the oxide 920 and the liner 704 fill an upper portion 689 (e.g., relative to the surface 699 of the substrate 110) of the trench 687 and the oxide 910 fills a lower portion 688 (e.g., relative to the surface 699 of the substrate 110) of the trench 687. At block 913, shown by FIG. 6G, a high-k metal gate 120 is formed above the liner 704 and the polished oxide 910 that was deposited using HDP. The gate 120 contacts the top surface 696 of the oxide 920 and the top surfaces 697 of the liner 704. It is noted the polishing in FIG. 6F, but illustrated in FIG. 6G, causes the top surface 696 of the oxide 920 and the top surfaces 697 of the liner 704 to align with a top surface 699 of the substrate 110. The resulting semiconductor device reduces or minimizes undesired oxygen diffusion and ingress from the deposited oxide into the gate 120 region.

Figure 7:
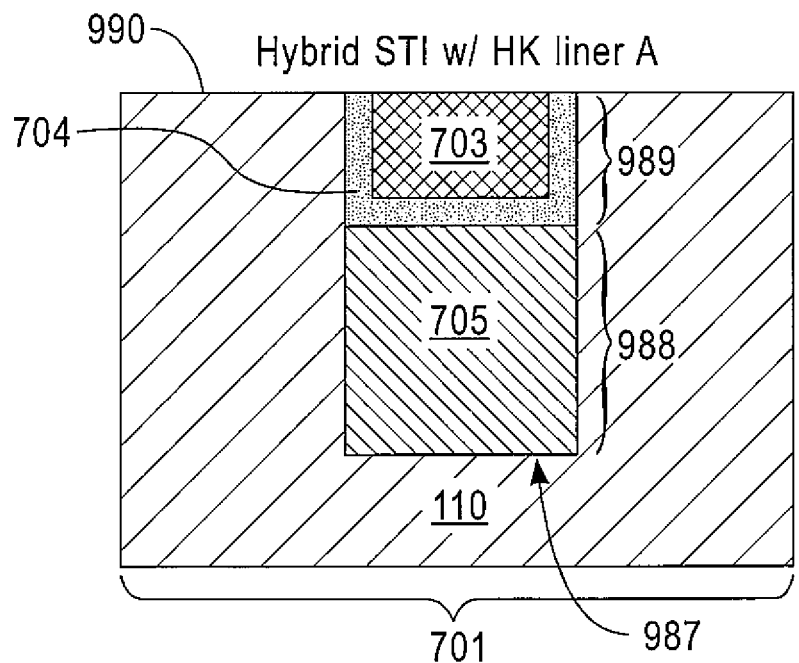
FIG. 7 sets forth a first illustrative shallow trench isolation in a semiconductor device fabricated using the method of FIG. 5.

FIG. 7 sets forth a first illustrative shallow trench isolation in a semiconductor device fabricated using the method of FIG. 5. A first layer of oxide 805 is provided using a HARP process. A liner 804 at least partially encases and contacts the first layer of oxide 805. The liner 804 may be fabricated using any insulator that is an oxygen sink or an oxygen barrier. Illustrative examples of oxygen sinks include, but are not limited to, $HfO_2$ and/or $HfSiO_4$. An illustrative example of an oxygen barrier includes, but is not limited to, SiN. A second layer of oxide 803 is provided using, e.g., an HDP process. The liner 804 minimizes or reduces or prevents oxygen from diffusing into a gate region above the second layer of oxide 803. It can be seen that the oxide 803 fills an upper portion 989 (e.g., relative to the surface 990 of the substrate 110) of the trench 987 and the oxide 805 and liner 804 fill a lower portion 988 (e.g., relative to the surface 990 of the substrate 110) of the trench 987. Pursuant to various alternate embodiments, the second layer of oxide 803 may be provided using a HARP process in lieu of, or in addition to, an HDP process. It is assumed the oxygen concentration in an oxide formed by a HARP process is higher than the oxygen concentration in an oxide formed by an HDP process. It is also assumed that the oxygen concentration in oxide formed by one process will be approximately the same (e.g., within manufacturing variances) of an oxide concentration formed by the same process.

Figure 8:
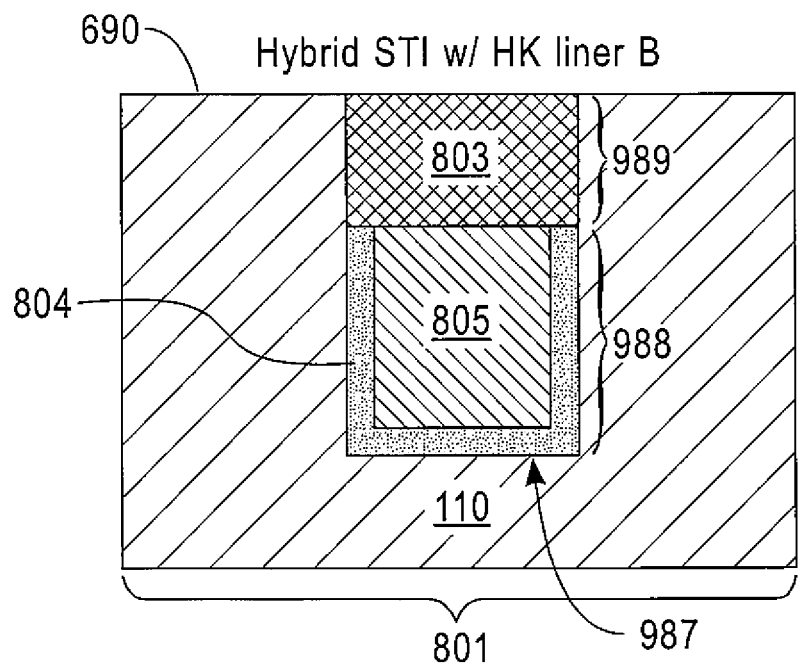
FIG. 8 sets forth a second illustrative shallow trench isolation in a semiconductor device fabricated using the method of FIG. 6.

FIG. 8 sets forth a second illustrative shallow trench isolation in a semiconductor device fabricated using a modification to the method of FIG. 6. A first layer of oxide 705 is provided using a HARP process. A second layer of oxide 703 is provided using an HDP process. A liner 704 (FIGS. 6 and 8) at least partially encases and contacts sides of the second layer of oxide 703. The liner 704 may be fabricated using any insulator that is an oxygen sink or an oxygen barrier. Illustrative examples of oxygen sinks include, but are not limited to, $HfO_2$ and/or $HfSiO_4$. An illustrative example of an oxygen barrier includes, but is not limited to, SiN. The liner 704 minimizes or reduces or prevents oxygen from diffusing into a gate region above the second layer of oxide 703. It can be seen that the oxide 703 and the liner 704 fill an upper portion 989 (e.g., relative to the surface 990 of the substrate 110) of the trench 987 and the oxide 705 fills a lower portion 988 (e.g., relative to the surface 990 of the substrate 110) of the trench 987. Pursuant to various alternate embodiments, the second layer of oxide 703 may be provided using a HARP process in lieu of or in addition to, an HDP process.

Processing of semiconductors is largely or completely controlled by machines. Consequently, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document a computer readable storage medium may be any tangible, non-transitory medium that can contain, or store a program for use by or in connection with an instruction execution system, apparatus, or device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A semiconductor device comprising:
    a shallow trench isolation formed in a semiconductor substrate, the shallow trench isolation comprising a first oxide formed in a lower portion of a trench of the shallow trench isolation and a second oxide formed in an upper portion of the trench and above a surface of the first oxide; and
    a portion of the semiconductor device completely traversing the trench, the portion being formed over and contacting a portion of an essentially planar top surface of the second oxide that extends from adjacent to a first side of the trench to adjacent to a second side of the trench opposite the first side.

2. The semiconductor device of claim 1, wherein an oxygen concentration of the second oxide is lower than an oxygen concentration of the first oxide.

3. The semiconductor device of claim 1, wherein an oxygen concentration of the second oxide is approximately the same as an oxygen concentration of the first oxide.

4. The semiconductor device of claim 1, wherein the portion of the semiconductor device comprises a high dielectric constant metal gate.

5. The semiconductor device of claim 4, wherein the high dielectric constant metal gate completely traverses the trench and regions of the semiconductor substrate on opposite sides of the trench.

6. The semiconductor device of claim 1, wherein the semiconductor substrate comprises one of a silicon-on-insulator substrate and a bulk silicon substrate.

7. A semiconductor device comprising:
    a shallow trench isolation formed in a semiconductor substrate, the shallow trench isolation comprising a first oxide formed in a lower portion of a trench of the shallow trench isolation and a second oxide formed in an upper portion of the trench and above a surface of the first oxide; and
    a portion of the semiconductor device formed over and contacting at least a portion of a surface of the second oxide, wherein an oxygen concentration of the second oxide is lower than an oxygen concentration of the first oxide.

8. The semiconductor device of claim 7, further comprising a liner at least partially conforming to interior surfaces of the lower portion of the trench, wherein the liner at least partially encases sides of the first oxide, wherein the second oxide is formed over and in contact with a part of the surface of the first oxide, over top surfaces of the liner, and to contact interior surfaces of the upper portion of the trench.

9. The semiconductor device of claim 8, wherein the liner comprises a high-k material.

10. The semiconductor device of claim 8, wherein the liner comprises at least one of an oxygen sink or an oxygen barrier.

11. The semiconductor device of claim 10, wherein the liner comprises at least one of $HfO_2$, $HfSiO_4$, or SiN.

12. The semiconductor device of claim 7, wherein the portion of the semiconductor device comprises a high dielectric constant metal gate that completely traverses the trench.

13. The semiconductor device of claim 12, wherein the high dielectric constant metal gate further completely traverses regions of the semiconductor substrate on opposite sides of the trench.

14. A semiconductor device comprising:
    a shallow trench isolation formed in a semiconductor substrate, the shallow trench isolation comprising a first oxide formed in a lower portion of a trench of the shallow trench isolation and a second oxide formed in an upper portion of the trench and above a surface of the first oxide;
    a portion of the semiconductor device formed over and contacting at least a portion of a surface of the second oxide; and, a liner at least partially conforming to and contacting interior surfaces of the upper portion of the trench and conforming to and contacting an upper surface of the first oxide, wherein the liner at least partially encases sides of the second oxide, and wherein the portion of the semiconductor device is formed over and contacts top surfaces of the liner in addition to the at least the portion of the surface of the second oxide.

15. The semiconductor device of claim 14, wherein an oxygen concentration of the second oxide is lower than an oxygen concentration of the first oxide, and wherein the liner comprises a high-k material.

16. The semiconductor device of claim 14, wherein the liner comprises at least one of an oxygen sink or an oxygen barrier.

17. The semiconductor device of claim 16, wherein an oxygen concentration of the second oxide is lower than an oxygen concentration of the first oxide.

18. The semiconductor device of claim 16, wherein an oxygen concentration of the second oxide is approximately the same as an oxygen concentration of the first oxide.

19. The semiconductor device of claim 16, wherein the liner comprises at least one of $HfO_2$, $HfSiO_4$, or SiN.

20. The semiconductor device of claim 14, wherein the portion of the semiconductor device comprises a high dielectric constant metal gate that completely traverses the trench and further traverses regions of the semiconductor substrate on opposite sides of the trench.

* * * * *